| (12) | United States Patent | (10) Patent No.: | US 9,223,718 B2 |
|---|---|---|---|
| | Vogt | (45) Date of Patent: | Dec. 29, 2015 |

(54) MEMORY DEVICE RESPONDING TO DEVICE COMMANDS FOR OPERATIONAL CONTROLS

(75) Inventor: Pete Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 13/976,407

(22) PCT Filed: Mar. 20, 2012

(86) PCT No.: PCT/US2012/029809
§ 371 (c)(1),
(2), (4) Date: Jun. 26, 2013

(87) PCT Pub. No.: WO2013/141851
PCT Pub. Date: Sep. 26, 2013

(65) Prior Publication Data
US 2013/0297863 A1    Nov. 7, 2013

(51) Int. Cl.
G06F 13/00      (2006.01)
G06F 3/00       (2006.01)
G06F 12/08      (2006.01)
G06F 12/02      (2006.01)
G11C 7/10       (2006.01)
G11C 7/22       (2006.01)

(52) U.S. Cl.
CPC ........ *G06F 12/0891* (2013.01); *G06F 12/0246* (2013.01); *G11C 7/1075* (2013.01); *G11C 7/222* (2013.01); *G11C 7/225* (2013.01)

(58) Field of Classification Search
None
See application file for complete search history.

(56) References Cited

U.S. PATENT DOCUMENTS

| 7,466,577 | B2 * | 12/2008 | Sekiguchi et al. ............... 365/51 |
| 7,523,282 | B1 | 4/2009 | Kapil et al. |
| 7,714,425 | B2 | 5/2010 | Yamaguchi et al. |
| 7,830,692 | B2 | 11/2010 | Chung et al. |
| 7,894,230 | B2 | 2/2011 | Kim |
| 2007/0102803 | A1 * | 5/2007 | Gann ............................ 257/686 |
| 2011/0126039 | A1 | 5/2011 | Kim et al. |
| 2011/0158032 | A1 | 6/2011 | Kang |

OTHER PUBLICATIONS

International Search Report and Written Opinion of the International Searching Authority dated Nov. 29, 2012, in International Patent Application No. PCT/US2012/029809, 8 pages.
Office Action (including search report) dated Jun. 17, 2015 (+ English translation), in Taiwan Patent Application No. 102106219, 17 pages.

* cited by examiner

*Primary Examiner* — Idriss N Alrobaye
*Assistant Examiner* — Richard B Franklin
(74) *Attorney, Agent, or Firm* — Blakely, Sokoloff, Taylor & Zafman LLP

(57) ABSTRACT

A memory device responding to device commands for operational controls. An embodiment of memory device includes one or more memory elements, a system element including a memory controller, and a physical interface including command input pins to receive commands for the memory device. The commands include commands for operational controls for the memory device, including one or both of a first command for a reset control to reset the memory device and a second command for a clock enable (CKE) control to halt internal clock distribution for the memory device.

24 Claims, 6 Drawing Sheets

FIG. 4

| Command Pin # | cmd5 | | | | cmd4 | | | | | | cmd3 | | | | | | cmd2 | | | | | | cmd1 | | | | | | cmd0 | | | | |
|---|---|---|---|---|---|---|---|---|---|---|---|---|---|---|---|---|---|---|---|---|---|---|---|---|---|---|---|---|---|---|---|---|---|
| Command Bit # | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| NOP | 0 | 0 | 0 | 0 | 0 | 0 | 0 | 0 | X | X | X | X | X | X | X | X | X | X | X | X | X | X | 1 | 0 |
| Activate | P | 1 | RS | DRAM Bank | | | | | DRAM Row Address | | | | | | | | | | | | | | X | X |
| Read | P | 0 | RS | DRAM Bank | | | | | X | X | Lane | | X | X | X | SP | AP | X | X | DRAM ColumnAddress | | | | |
| Write | P | 0 | RS | DRAM Bank | | | | | X | X | Lane | | X | X | X | X | AP | X | X | DRAM ColumnAddress | | | | |
| Precharge | P | 0 | RS | X | 0 | 0 | 0 | 1 | 0 | 0 | X | X | X | X | X | X | X | X | X | X | X | X | X | X |
| Precharge All | P | 0 | X | X | 0 | 0 | 1 | 1 | 1 | 0 | X | X | X | X | X | X | X | X | X | X | X | X | X | X |
| Auto(CBR)Refresh | P | 0 | RS | X | 0 | 0 | 1 | 1 | 1 | 1 | X | X | X | X | X | X | X | X | X | X | X | X | X | X |
| ZQ Calibration | P | 0 | RS | X | 0 | 0 | 1 | 0 | X | X | X | X | X | X | S/L | D | R | X | X | X | X | X | X | X |
| Enter Self Refresh | P | 0 | X | X | 0 | 1 | 0 | 0 | X | X | X | X | X | X | X | X | X | X | X | X | X | X | X | X |
| Enter Power Down | P | 0 | X | X | 0 | 1 | 1 | 0 | X | X | X | X | X | X | X | X | X | X | X | X | X | X | X | X |
| Enter CKE | P | 0 | X | X | 0 | 1 | 1 | 0 | 0 | X | X | X | X | X | X | X | X | X | X | X | X | X | X | X |
| Mode Register Set | P | 0 | X | X | 1 | 1 | 1 | 1 | 1 | X | X | X | X | X | X | X | X | X | X | X | X | X | X | X |
| Exit Self Refresh / Exit Power Down/ Exit CKE | P | 0 | X | 0 | 1 | 1 | 1 | 1 | X | X | X | X | X | X | X | X | X | X | X | X | X | X | X | X |
| Reset | 0 | 0 | 0 | 0 | 1 | 1 | 1 | 1 | X | X | X | X | X | X | X | X | X | X | X | X | X | X | X | X |

Notes: The values in "X" fields in non-reserved commands above may be driven onto the DRAM device pins.

After the Enter CKE command only the cmd 5 signal is enabled until an Exit CKE command is detected Sufficient address bits for 4TB devices $2^{39} = 512\text{GB per stack} = 5(32\text{Bytes/access}) + 19(\text{Row}) + 7(\text{Column}) + 2(\text{Banks}) + 4(\text{channels}) + 2(\text{Ranks})$

| P | Parity: Even parity, all zeros is valid parity, X bits are included in parity calculation |
|---|---|
| RS | Rank Select: 0=lower 4 slices, 1=upper 4 slices |
| Lane | Lane Select: ignored by the DRAM device (except for parity checking), used by the microbuffer to select the lanes to use during Writes and Reads |

MEMORY DEVICE RESPONDING TO DEVICE COMMANDS FOR OPERATIONAL CONTROLS

TECHNICAL FIELD

Embodiments of the invention generally relate to the field of electronic devices and, more particularly, to a memory device responding to device commands for operational controls.

BACKGROUND

Memory devices include certain controls that affect the overall operation of the memory device. In particular, a memory device will generally include a Reset control to reset the memory device and a CKE (clock enable) control to disable and enable internal clock distribution of the memory device, and such controls will be engaged providing a signal to certain dedicated pins of the memory device. In a conventional memory device, when a certain signal is detected on the Reset pin, the memory device will perform a reset sequence. When a certain signal is detected on the CKE pin, the memory device turn off internal clock distribution, with the device ignoring clock operation.

However, as memory devices increase in complexity, the number of available pins for memory operations is reduced. In particular, a memory having multiple channels requires a large number of pins for operation, and the use of reset and CKE on dedicated pins is multiplied by the number of channels.

For example, a Wide 10 DRAM (Dynamic Random Access Memory) device may be implemented with 16 independent channels. In such a device, the reset and CKE functions thus require 32 pins, which have a significant effect on the available pin count on such a device.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4 is a diagram of a command structure for an embodiment of a memory device;

DETAILED DESCRIPTION

Figure 1:
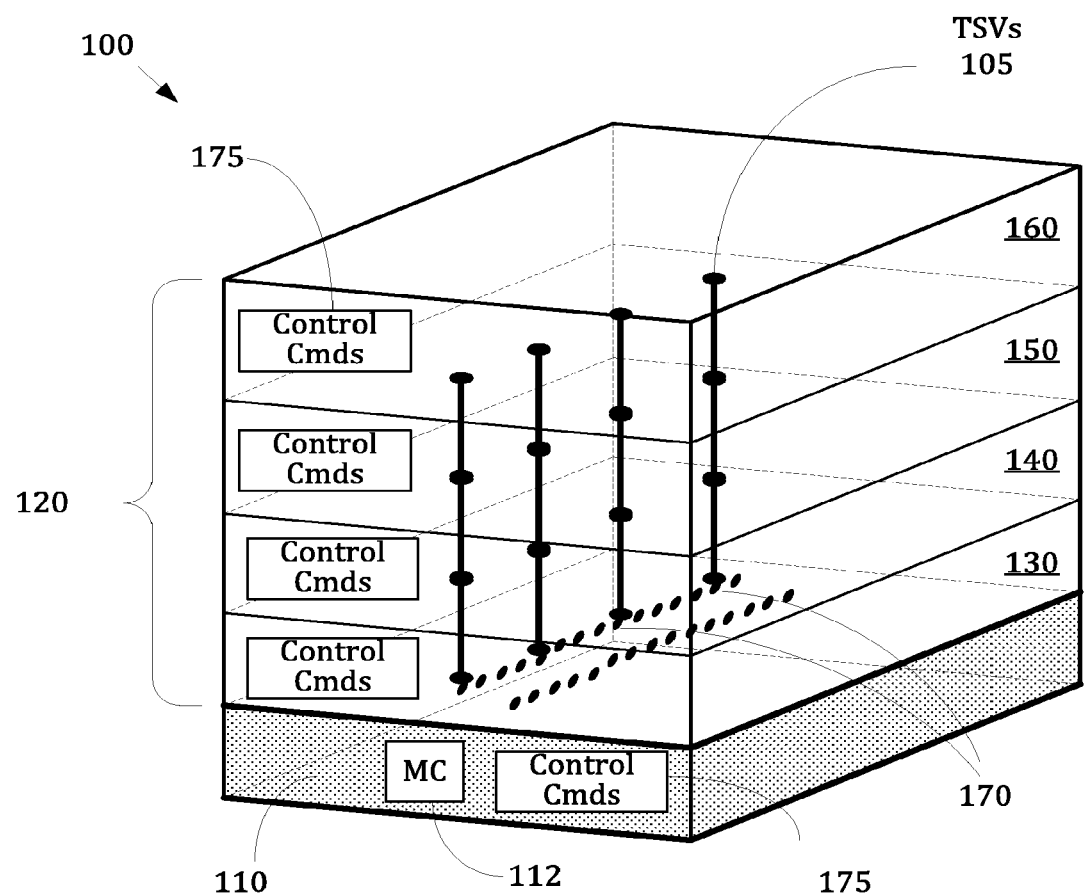
FIG. 1 illustrates an embodiment of a memory device responding to commands for operational controls.

Embodiments of the invention are generally directed to a memory device responding to device commands for operational controls.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics-processing unit (GPU). A stacked memory device may include one or more through silicon vias (TSVs) to connect points on different layers of the device.

In some embodiments, a memory device operates to respond to device commands for certain operational controls. In some embodiments, the memory handles such operational controls using otherwise available commands, without use of a dedicated pin, bump, or other contact (referred to generally herein as a pin). In some embodiments, a memory device includes a command structure that includes a first command for entering a Reset operation, a second command for entering a CKE operation, or both the first and second commands, where such structure may be used to reduce the cost and power consumption of the memory interface in comparison with conventional devices, and may be used to improve the user experience by providing longer battery life in a mobile device.

Existing DRAM interface protocols deliver the Enter CKE, and Enter Reset controls as dedicated pins. In some embodiments, an apparatus, system, and method a memory responds to a first command for entering a Reset operation without use of a dedicated reset pin. In some embodiments, a memory responds to a second command for entering a CKE operation (turning off internal clock distribution of the memory device) without use of a dedicated clock enable pin. In some embodiments, a memory structure allows for reducing the required pin count for a memory device with regard to device Reset and CKE operational controls.

In an example, a Fast Wide 10 device has 16 independent channels. In this structure, the number of pins of a physical interface normally used by a DRAM memory channel is multiplied by 16, with the operational control pins provided for each independent channel. Reducing the required pin count of the interface in this case has a significant impact, with the elimination of a first dedicated pin of each channel for entering Reset and a second dedicated pin of each channel for entering CKE, thus eliminating a total of 32 dedicated pins for the memory device. In some embodiments, an apparatus, system, or method provides for encoding the CKE and Reset pin functions into spare command codes for the memory device. The encoding of CKE and Reset pin functions eliminates these dedicated pins, and in the case of Fast Wide JO technology reduces the TSV ball count by at least 32 pins.

In some embodiments, a device or system uses certain command encodings to communicate the enter CKE and enter Reset control functions from the host to the memory, where the command encodings may be spare command encodings that not utilized for other purposes. In some embodiments, a dedicated Reset pin for a memory is eliminated by delivering a Reset command as a unique command encoding that does not require clock alignment by a memory.

In some embodiments, an encoding that delivers a constant one or zero on certain command input pins, such as '0000' on a first command input pin and '1111' on a second command input pin, provides a required command code without any need for the memory to recognize clock alignment. In some embodiments, with a constant signal value of one or zero, even if the time multiplexed command delivery becomes out of sync, the reset command may be detected and can bring the DRAM back to a known state.

In some embodiments, for enter CKE operation, a command from a host device is received by a DRAM device instructing the device to turn off its internal clock distribution where possible, and turning off one or more command input receivers and leaving a reduced set of one or more command input receivers turned on. In a particular implementation, all but a single command input receiver is turned off, thus providing for minimized power consumption. Embodiments are not limited to a single powered-on input receiver, but for simplicity of description such a receiver is generally described herein. In some embodiments, the single powered-on command input receiver enters an inactive state. In some embodiments, the single powered-on input receiver remains in the inactive state until the memory receives a request to return to operation from the host, which may be referred to as an Exit CKE command. In some embodiments, the Exit CKE request is a command, such as an existing command, that is shared by other operations for reactivating the memory device, such as Exiting Self-Refresh and Exiting Power Down, such that the CKE operation only requires a single additional command to perform the CKE operation. In some embodiments, the memory device operates to transition the DRAM out of the CKE state and activate the command input receivers in response to the receipt of an Exit CKE request at the powered-on command input receiver.

FIG. 1 illustrates an embodiment of a memory device responding to commands for operational controls. A memory device may be a 3D stacked memory including multiple layers, such as illustrated in FIG. 1, or may be a simpler memory structure with a single DRAM layer. In this illustration, a 3D stacked memory device 100 includes a system element 110 coupled with one or more DRAM memory die layers 120, also referred to herein as the memory stack. In some embodiments, the system element may be a system on chip (SoC) or other similar element. While FIG. 1 illustrates an implementation in which the system element 110 is coupled below the memory stack of one or more memory die layers 120, embodiments are not limited to this arrangement. For example, in some embodiments a system element 110 may be located adjacent to the memory stack 120, and thus may be coupled in a side-by-side arrangement with the memory stack 120.

In this illustration, the DRAM memory die layers include four memory die layers, these layers being a first memory die layer 130, a second memory die layer 140, a third memory die layer 150, and a fourth memory die layer 160. However, embodiments are not limited to any particular number of memory die layers in the memory stack 120, and may include a greater or smaller number of memory die layers. Among other elements, the system element 110 may include a memory controller 112 for the memory stack 120. In some embodiments, each memory die layer (with the possible exception of the top, or outermost, memory die layer, such as the fourth memory die layer 160 in this illustration) includes a plurality of through silicon vias (TSVs) 105 to provide paths through the silicon substrate of the memory die layers. A small number of TSV's 105 are provided for illustration, but embodiments are not limited to structures with any particular number of memory layers or channels, and the actual number of TSV's may be much greater than illustrated in FIG. 1.

In some embodiments, a plurality of pins 170 of a physical interface of the memory device includes a plurality of command input pins for the receipt of commands by the memory device. The illustrated pins are located on the surface (which in this illustration is the top surface) of the system element 110 that is adjacent to the memory stack 120. In some embodiments, the plurality of pins does not include dedicated command pins for a Reset command or a CKE command. In some embodiments, control commands 175 that are to be provided by the memory controller 112 or other controller and that are recognized by memory elements include a Reset command, the memory device to reset upon receipt of the Reset command, and an Enter CKE command, the memory device to halt internal clock distribution upon receipt of the Enter CKE command. In some embodiments, command signals allowing for elimination of dedicated pins may be carried by the TSV's 105 to the appropriate portions of the memory stack 120 to provide commands for each channel of the memory device 100.

Figure 2:
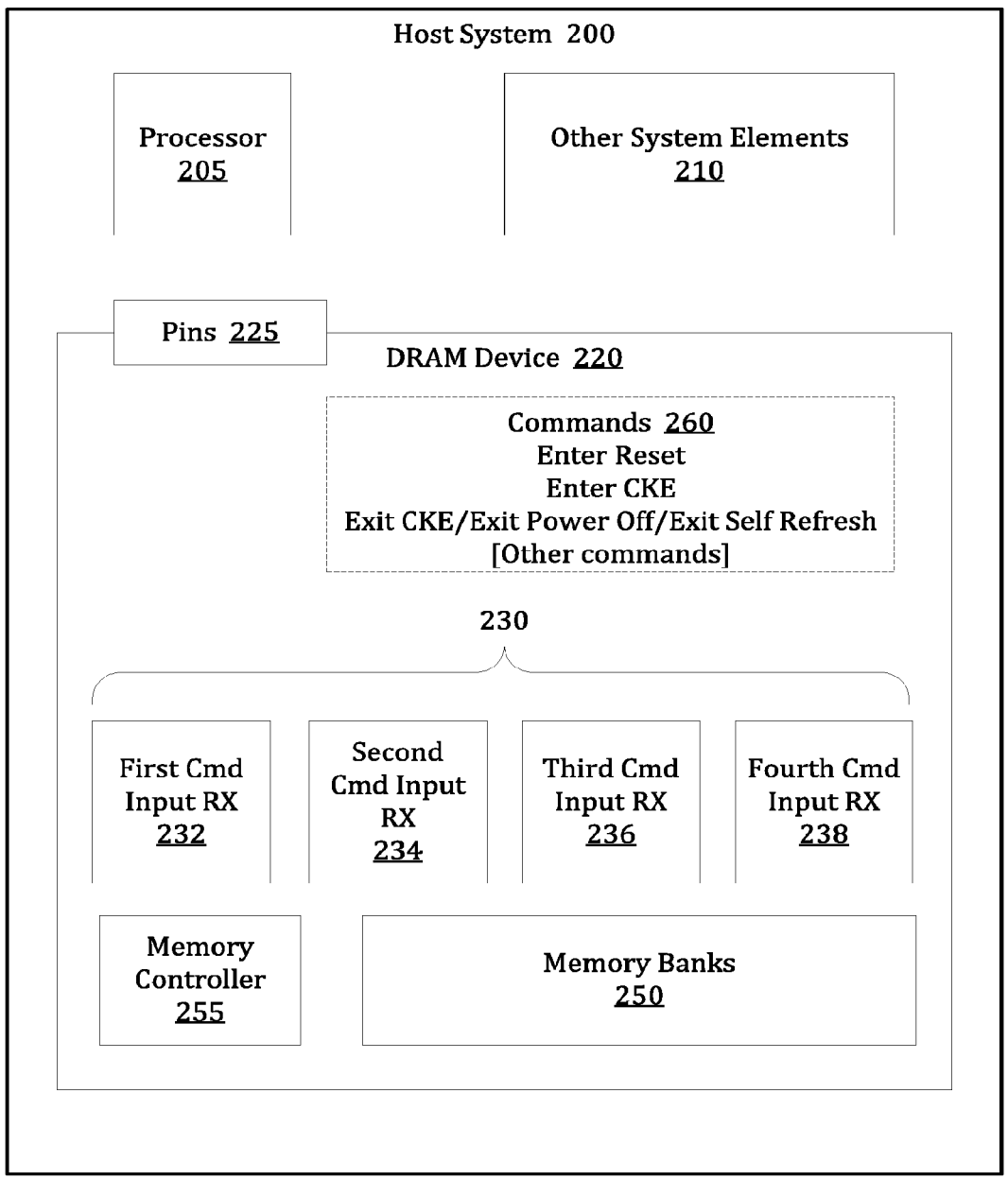
FIG. 2 illustrates an embodiment of a memory device including a command structure for Reset and Clock Enable operations.

FIG. 2 illustrates an embodiment of a memory device including a command structure for Reset and Clock Enable operations. In this illustration, a memory device 220 is included within or is otherwise coupled to a host system 200. In addition to other elements not illustrated here, the host system includes one or more processing elements, illustrated here as processor 205, that may provide one or more instructions to the memory device, and other system elements 210, such as elements illustrated in FIGS. 5 and 6. The memory may include a memory device with a plurality of independent channels, including a stacked memory device such a Wide IO or Fast Wide IO compatible device. In some embodiments, the memory device is capable of responding to operational controls through commands that are unique for a memory controller 255 of the memory device 220. In some embodiments, the operational control commands 260 include a Reset operational control to reset the memory device 220, a Clock Enable operational control to deactivate the memory device 220, or both the Reset and Clock Enable operational controls.

In some embodiments, the memory device 220 include a set of pins 225 (such as pins 170 illustrated in FIG. 1), including command input pins for the receipt of commands from the processor 205. In some embodiments, the set of pins does not include a dedicated Reset pin or a dedicated Clock Enable pin. The memory device may include a plurality of command input receivers 230, illustrated as a first command input receiver 232, a second command input receiver 234, a third command input receiver 236, and a fourth command input receiver 238. The memory device 220 further includes the memory controller 255 for control of the device and memory banks 250 for the storing of data.

In some embodiments, the host system has access to a plurality of commands, illustrated as commands 260, for the memory device 220. In some embodiments, a first command is RESET, where RESET is a unique command for the memory device that does not require clock alignment, such as a series of '1' or '0' signals on certain command input pins. In some embodiments, a second command is an Enter CKE command, where Enter CKE is a unique command for the memory device. In some embodiments, a third command is an Exit CKE command, where Exit CKE may be a shared command with certain other exit operations.

In some embodiments, in response to the first command, the memory device 220 enters a Reset state, resetting operations and returning to the active state. In some embodiments, the Reset state is entered without the set of pins 225 including a dedicated Reset pin.

In some embodiments, in response to the second command, the memory device 220 enters a CKE state, halting internal clock distribution in the memory device 220. In some embodiments, the CKE state is entered without the set of pins 225 including a dedicated CKE pin. In some embodiments, in response to the second command, the first command input receiver 232 enters an inactive state to await a command to exit the CKE state, while the remaining command input receivers 234-238 are powered off or otherwise disabled. In some embodiments, in response to a third command, the memory device exits the CKE state, where the Exit CKE command may be a shared command, such as a command shared with other exit functions.

Figure 3:
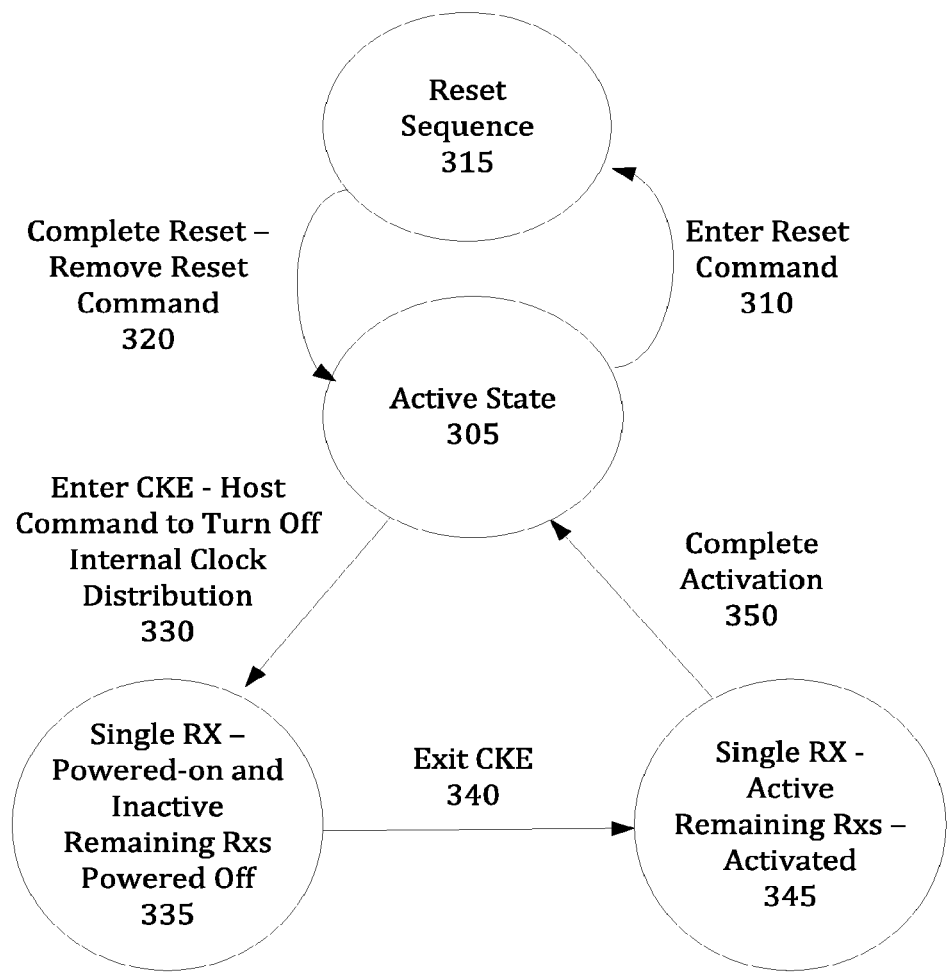
FIG. 3 is a state diagram to illustrate an embodiment of an apparatus, system, or process for handling operational controls for a memory through certain commands.

FIG. 3 is a state diagram to illustrate an embodiment of an apparatus, system, or process for handling operational controls for a memory through certain commands. In this illustration, a memory device may initially be in an active state 305. In some embodiments, upon receiving an Enter Reset command on general command input pins of the memory device 310, the memory device transitions to a reset sequence to reset the device 315. In some embodiments, the command is a command that does not required clock alignment, such as a constant '0' or '1' on certain command input pins. Upon removal of the Enter Reset Command encoding on the command input pins 320, the memory device may return to the active state 305.

In some embodiments, a memory device in the active state 305 may receive an Enter CKE command on general input pins of the memory device 330, the command instructing the disabling of internal clock distribution of the memory device. In some embodiments, in the CKE state a single input command receiver (or a greater number) remains powered on in an inactive state, while the remainder of the command input receivers are powered off 335. The memory device remains in such state until an Exit CKE command is received 340, where the command may also provide for other functions, such as leaving a power off state or leaving a self-refresh state. In some embodiments, upon receiving the Exit CKE command the single command input receiver is activated, followed by the remaining command input receivers being powered on and activated 345. Upon completing activation 350, the memory device may return to the active state.

FIG. 4 is a diagram of a command structure for an embodiment of a memory device. In this illustration, the command structure 400 includes signals for six general command pins, cmd0, cmd1, cmd2, cmd3, cmd4 and cmd5. The command pins are each illustrated as receiving four command bits in a command, such as bits 0-3 received at cmd0 through bits 20-23 received at cmd4.

In some embodiments, in addition to other commands, the command structure 400 includes an Enter CKE command, where the Enter CKE is unique to the commands of the memory device. In this illustration, the Enter CKE command includes a parity bit at bit 23 and a '0' at bit 22 of cmd5, '0110' at bits 19-16 of cmd4, and '0' at bit 15 of cmd3, with the remaining bits of the command pins being any value (X=Don't Care). In some embodiments, the command structure further includes an Exit CKE command, where the Exit CKE command may be a shared command with a command to exit other functions or states. In this illustration, Exit CKE is shared with Exit Self Refresh and Exit Power Down. In this illustration, the Exit CKE command includes a parity bit at bit 23 and a '0' at bit 22 of cmd5, and '0111' at bits 19-16 of cmd4, with the remaining bits of the command pins being any value.

In some embodiments, in addition to other commands, the command structure 400 includes a Reset command, where the Reset is unique to the commands of the memory device and is a command that does not require clock alignment. In this illustration, the Reset command includes '0000' at bits 19-22 of cmd5, and '1111' at bits 19-16 of cmd4, with the remaining bits of the command pins being any value.

Figure 5:
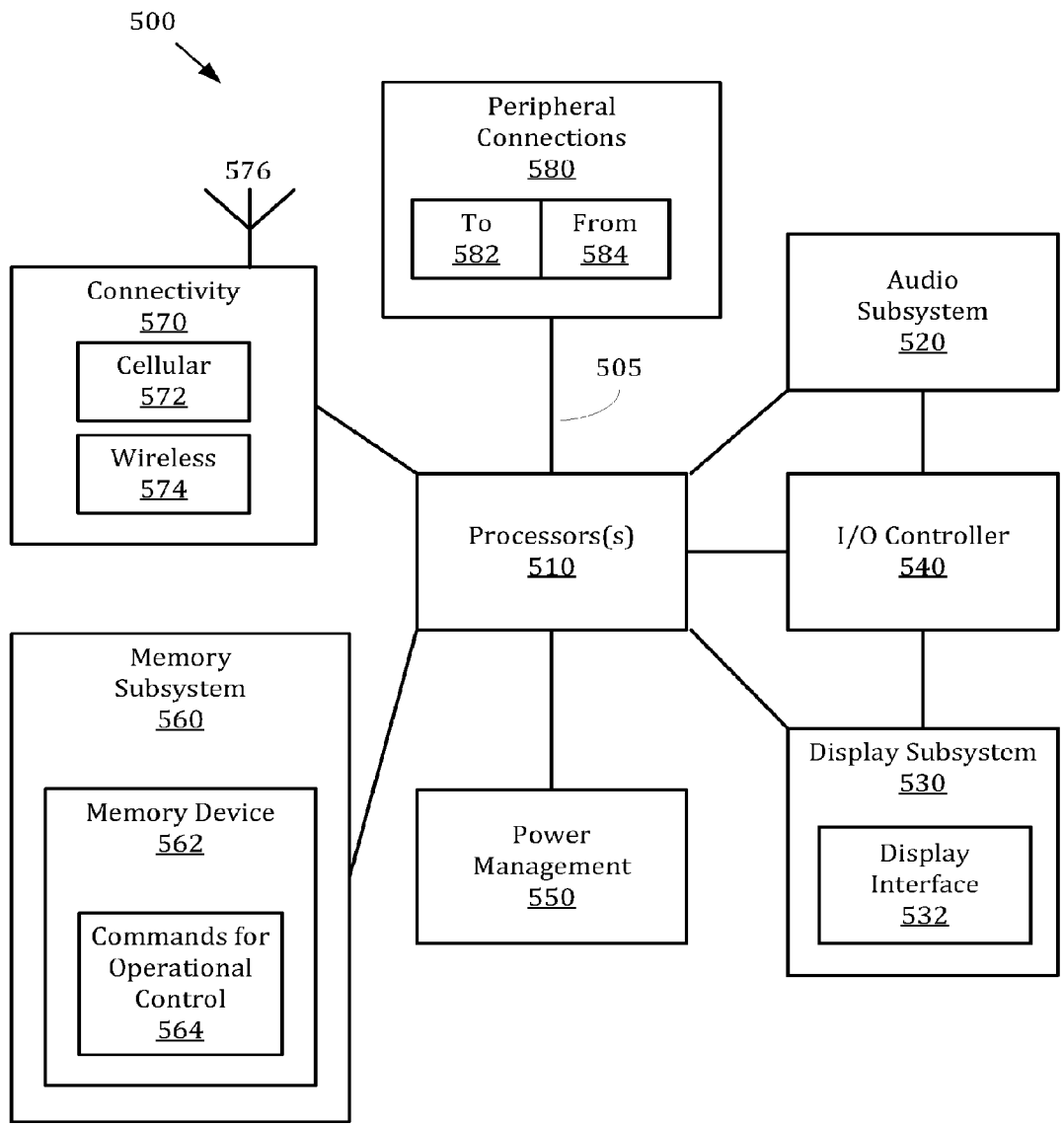
FIG. 5 is an illustration of an embodiment of a mobile device including operational controls for a memory through certain commands.

FIG. 5 is an illustration of an embodiment of a mobile device including operational controls for a memory through certain commands. Device 500 represents mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 500. The components may be connected by one or more buses or other connections 505.

Device 500 includes processor 510, which performs the primary processing operations of device 500. Processor 510 can include one or more physical devices, such as microprocessors, application processors, microcontrollers, programmable logic devices, or other processing means. The processing operations performed by processor 510 include the execution of an operating platform or operating system on which applications, device functions, or both are executed. The processing operations include operations related to I/O (input/output) with a human user or with other devices, operations related to power management, operations, or both related to connecting device 500 to another device. The processing operations may also include operations related to audio I/O, display I/O, or both.

In one embodiment, device 500 includes audio subsystem 520, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 500, or connected to device 500. In one embodiment, a user interacts with device 500 by providing audio commands that are received and processed by processor 510.

Display subsystem 530 represents hardware (such as display devices) and software (such as drivers) components that provide a display having visual, tactile, or both elements for a user to interact with the computing device. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen device that provides both output and input to a user.

I/O controller 540 represents hardware devices and software components related to interaction with a user. I/O controller 540 can operate to manage hardware that is part of audio subsystem 520, a display subsystem 530, or both such subsystems. Additionally, I/O controller 540 illustrates a connection point for additional devices that connect to device 500 through which a user might interact with the system. For example, devices that can be attached to device 500 might include microphone devices, speaker or stereo systems, video systems or other display device, keyboard or keypad devices, or other I/O devices for use with specific applications.

As mentioned above, I/O controller 540 may interact with audio subsystem 520, display subsystem 530, or both such subsystems. For example, input through a microphone or other audio device can provide input or commands for one or more applications or functions of device 500. Additionally, audio output can be provided instead of or in addition to display output. In another example, if display subsystem includes a touch screen, the display device also acts as an input device, which can be at least partially managed by I/O controller 540. There can also be additional buttons or switches on device 500 to provide I/O functions managed by I/O controller 540.

In one embodiment, I/O controller 540 manages devices such as accelerometers, cameras, light sensors or other environmental sensors, or other hardware that can be included in device 500. The input can be part of direct user interaction, as well as providing environmental input to the system to influence its operations (such as filtering for noise, adjusting displays for brightness detection, applying a flash for a camera, or other features).

In one embodiment, device 500 includes power management 550 that manages battery power usage, charging of the battery, and features related to power saving operation.

In some embodiments, memory subsystem 560 includes memory devices for storing information in device 500. The processor 510 may read and write data to elements of the memory subsystem 560. Memory can include nonvolatile memory (having a state that does not change if power to the memory device is interrupted) including flash memory, volatile memory (having a state that is indeterminate if power to the memory device is interrupted), or both such memories. Memory 560 can store application data, user data, music, photos, documents, or other data, as well as system data (whether long-term or temporary) related to the execution of the applications and functions of system 500.

In some embodiments, the memory subsystem 560 may include a stacked memory device 562, where the stacked memory device includes one or more memory die layers and a system element such as illustrated in FIG. 1. However, embodiments are not limited to this memory structure. In some embodiments, the stacked memory device 562 may be structured such that memory die elements and a system element are arranged adjacent to each other, or in another arrangement. In some embodiments, the stacked memory device operates in response to commands for operational control 564, such as illustrated in FIGS. 1-4.

Connectivity 570 includes hardware devices (e.g., connectors and communication hardware for wireless communication, wired communication, or both) and software components (e.g., drivers, protocol stacks) to enable device 500 to communicate with external devices. The device could be separate devices, such as other computing devices, wireless access points or base stations, as well as peripherals such as headsets, printers, or other devices.

Connectivity 570 can include multiple different types of connectivity. To generalize, device 500 is illustrated with cellular connectivity 572 and wireless connectivity 574. Cellular connectivity 572 refers generally to cellular network connectivity provided by wireless carriers, such as provided via 4G/LTE (Long'term Evolution), GSM (global system for mobile communications) or variations or derivatives, CDMA (code division multiple access) or variations or derivatives, TDM (time division multiplexing) or variations or derivatives, or other cellular service standards. Wireless connectivity 574 refers to wireless connectivity that is not cellular, and can include personal area networks (such as Bluetooth), local area networks (such as WiFi), wide area networks (such as WiMax), and other wireless communications. Connectivity may include one or more omnidirectional or directional antennas 576.

Peripheral connections 580 include hardware interfaces and connectors, as well as software components (e.g., drivers, protocol stacks) to make peripheral connections. It will be understood that device 500 could both be a peripheral device ("to" 582) to other computing devices, as well as have peripheral devices ("from" 584) connected to it. Device 500 commonly has a "docking" connector to connect to other computing devices for purposes such as managing (such as downloading, uploading, changing, or synchronizing) content on device 500. Additionally, a docking connector can allow device 500 to connect to certain peripherals that allow device 500 to control content output, for example, to audiovisual or other systems.

In addition to a proprietary docking connector or other proprietary connection hardware, device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 6:
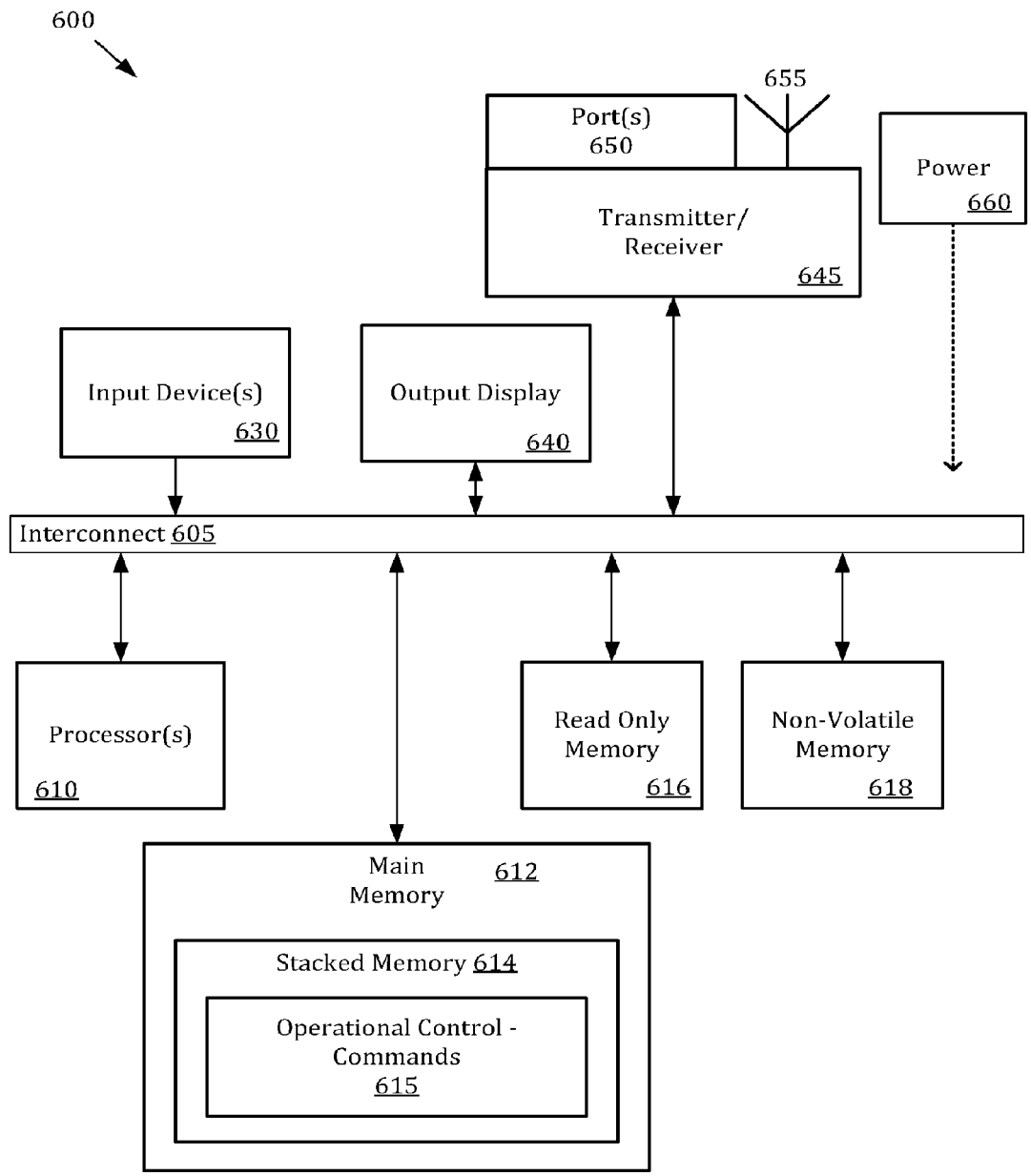
FIG. 6 illustrates an embodiment of an apparatus or system including operational controls for a memory through certain commands.

FIG. 6 illustrates an embodiment of an apparatus or system including operational controls for a memory through certain commands. A computing system 600 may include a computer, server, game console, or other computing apparatus. In this illustration, certain standard and well-known components that are not germane to the present description are not shown. Under some embodiments, the computing system 600 comprises an interconnect or crossbar 605 or other communication means for transmission of data. The computing system 600 may include a processing means such as one or more processors 610 coupled with the interconnect 605 for processing information. The processors 610 may comprise one or more physical processors and one or more logical processors. The interconnect 605 is illustrated as a single interconnect for simplicity, but may represent multiple different interconnects or buses and the component connections to such interconnects may vary. The interconnect 605 shown in FIG. 6 is an abstraction that represents any one or more separate physical buses, point-to-point connections, or both connected by appropriate bridges, adapters, or controllers.

In some embodiments, the computing system 600 further comprises a random access memory (RAM) or other dynamic storage device or element as a main memory 612 for storing information and instructions to be executed by the processors 610. RAM memory includes dynamic random access memory (DRAM), which requires refreshing of memory contents, and static random access memory (SRAM), which docs not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 612 includes stacked memory 614, wherein the stacked memory includes operational control 615, which may specifically include Reset and CKE commands, such as illustrated in FIGS. 1-4.

The computing system 600 also may comprise a read only memory (ROM) 616 or other static storage device for storing static information and instructions for the processors 610. The computing system 600 may include one or more non-volatile memory elements 618 for the storage of certain elements, where non-volatile memory may include flash memory.

In some embodiments, the computing system 600 includes one or more input devices 630, where the input devices include one or more of a keyboard, mouse, touch pad, voice command recognition, gesture recognition, or other device for providing an input to a computing system.

The computing system 600 may also be coupled via the interconnect 605 to an output display 640. In some embodiments, the display 640 may include a liquid crystal display (LCD) or any other display technology, for displaying information or content to a user. In some environments, the display 640 may include a touch-screen that is also utilized as at least a part of an input device. In some environments, the display 640 may be or may include an audio device, such as a speaker for providing audio information.

One or more transmitters or receivers 645 may also be coupled to the interconnect 605. In some embodiments, the computing system 600 may include one or more ports 650 for the reception or transmission of data. The computing system 600 may further include one or more omnidirectional or directional antennas 655 for the transmission or reception of data via radio signals.

The computing system 600 may also comprise a power device or system 660, which may comprise a power supply, a battery, a solar cell, a fuel cell, or other system or device for providing or generating power. The power provided by the power device or system 660 may be distributed as required to elements of the computing system 600.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes one or more memory elements; a system element including a memory controller; and a physical interface including a plurality of command input pins to receive a plurality of commands for the memory device. In some embodiments, the plurality of commands include commands for operational controls for the memory device, the plurality of commands including one or both of a first command for a reset control to reset the memory device and a second command for a clock enable (CKE) control to halt internal clock distribution for the memory device.

In some embodiments, the memory device does not include a dedicated pin for the reset control or for the clock enable control.

In some embodiments, the first command and the second commands are unique commands of the plurality of commands of the memory device.

In some embodiments, the first command of the memory device for the reset control is a command that does not require clock alignment. In some embodiments, the first command of the memory device includes constant signal values on one or more of the command input pins. In some embodiments, the first command of the memory device includes a constant '0' signal on a first command input pin and a constant '1' on a second command input pin.

In some embodiments, the memory device further includes a plurality of command input receivers, wherein in response to the second command the memory device is to power down one or more of the plurality of command input receivers and is to place a first command input receiver in an inactive state, the first command receiver to remain powered in the inactive state.

In some embodiments, in response to a third command received by the first command input receiver the memory device is to activate the plurality of command input receivers. In some embodiments, the third command of the memory device is a command that is shared with one or more other operations.

In some embodiments, the memory device is a stacked memory device including a plurality of layers. In some embodiments, the memory device includes a plurality of channels.

In some embodiments, a method includes receiving at a memory device a command of a plurality of commands for an operational control of the memory device; and performing the operational control in response to the receipt of the command. In some embodiments, the plurality of commands includes one or both of a first command for a reset control to reset the memory device and a second command for a clock enable (CKE) control to halt internal clock distribution for the memory.

In some embodiments, receiving the first command or the second command includes receiving signals on command input pins of the memory device.

In some embodiments, the first command and the second commands are unique commands of the plurality of commands.

In some embodiments, the method further includes in response to receipt of the second command powering down one or more of a plurality of command input receivers of the memory device and placing a first command input receiver of the plurality of receivers in response in an inactive state.

In some embodiments, the method further includes upon receipt of a third command at the first input command receiver reactivating the plurality of command input receivers.

In some embodiments, a system includes a bus; a memory device coupled to the bus, the memory device including one or more memory die layers, a system element coupled with the memory stack, and a physical interface including a plurality of command input pins to receive a plurality of commands from the system for the memory device; a processor coupled to the bus, the processor to read data from and write data to the stacked memory device; and a flash memory element for storing data. In some embodiments, wherein the plurality of commands include commands for operational controls for the memory device, the plurality of commands including one or both of a first command for a reset control to reset the memory device and a second command for a clock enable (CKE) control to halt internal clock distribution for the memory device.

In some embodiments, the memory device of the system does not include a dedicated pin for the reset control or for the clock enable control.

In some embodiments, the first command and the second commands of the memory device of the system are unique commands of the plurality of commands.

In some embodiments, the memory device of the system further includes a plurality of command input receivers, and wherein in response to the second command the memory device is to power down one or more of the plurality of command input receivers and is to place a first command input receiver in an inactive state, the first command receiver to remain powered in the inactive state.

In some embodiments, in response to a third command received by the first command input receiver the memory device of the system is to activate the plurality of command input receivers.

What is claimed is:

1. A memory device comprising:
   one or more memory elements;
   a system element including a memory controller; and
   a physical interface including a plurality of command input pins, wherein the plurality of command input pins are together to receive each command of a plurality of commands for the memory device;
   wherein the plurality of commands include commands for operational controls for the memory device;
   wherein the plurality of commands includes both a first command for a reset control to reset the memory device and a second command for a clock enable (CKE) control to halt internal clock distribution for the memory device, wherein the memory device does not include a dedicated pin for the reset control and does not include a dedicated pin for the clock enable control.

2. The memory device of claim 1, wherein the first command and the second command are unique commands of the plurality of commands.

3. The memory device of claim 1, where the first command for the reset control is a command that does not require clock alignment.

4. The memory device of claim 3, wherein the first command includes constant signal values on one or more of the command input pins.

5. The memory device of claim 4, wherein the first command includes a constant '0' signal on a first command input pin and a constant '1' on a second command input pin.

6. The memory device of claim 1, further comprising a plurality of command input receivers, wherein in response to the second command the memory device is to power down one or more of the plurality of command input receivers and is to place a first command input receiver in an inactive state, the first command receiver to remain powered in the inactive state.

7. The memory device of claim 6, wherein in response to a third command received by the first command input receiver the memory device is to activate the plurality of command input receivers.

8. The memory device of claim 7, wherein the third command is a command that is shared with one or more other operations.

9. The memory device of claim 1, wherein the memory device is a stacked memory device including a plurality of layers.

10. The memory device of claim 9, wherein the memory device includes a plurality of channels.

11. A method comprising:
receiving at a plurality of command input pins of a memory device a command of a plurality of commands for an operational control of the memory device, wherein the plurality of command input pins are together to receive each command of the plurality of commands for the memory device; and
performing the operational control in response to the receipt of the command;
wherein the plurality of commands includes both a first command for a reset control to reset the memory device and a second command for a clock enable (CKE) control to halt internal clock distribution for the memory, wherein the memory device does not include a dedicated pin for the reset control and does not include a dedicated pin for the clock enable control.

12. The method of claim 11, wherein the first command and the second command are unique commands of the plurality of commands.

13. The method of claim 11, further comprising in response to receipt of the second command powering down one or more of a plurality of command input receivers of the memory device and placing a first command input receiver of the plurality of receivers in an inactive state.

14. The method of claim 13, further comprising upon receipt of a third command at the first input command receiver reactivating the plurality of command input receivers.

15. The method of claim 11, where the first command for the reset control is a command that does not require clock alignment.

16. The method of claim 15, wherein the first command includes constant signal values on one or more of the command input pins.

17. The method of claim 16, wherein the first command includes a constant '0' signal on a first command input pin and a constant '1' on a second command input pin.

18. A system comprising:
a bus;
a memory device coupled to the bus, the memory device including:
a memory stack including one or more memory die layers,
a system element coupled with the memory stack, and
a physical interface including a plurality of command input pins, wherein the plurality of command input pins are together to receive each command of a plurality of commands from the system for the memory device;
a processor coupled to the bus, the processor to read data from and write data to the stacked memory device; and
a flash memory element to store data;
wherein the plurality of commands include commands for operational controls for the memory device;
wherein the plurality of commands includes both a first command for a reset control to reset the memory device and a second command for a clock enable (CKE) control to halt internal clock distribution for the memory device, wherein the memory device does not include a dedicated pin for the reset control and does not include a dedicated pin for the clock enable control.

19. The system of claim 18, wherein the first command and the second command are unique commands of the plurality of commands.

20. The system of claim 19, wherein the memory device further includes a plurality of command input receivers, and wherein in response to the second command the memory device is to power down one or more of the plurality of command input receivers and is to place a first command input receiver in an inactive state, the first command receiver to remain powered in the inactive state.

21. The system of claim 20, wherein in response to a third command received by the first command input receiver the memory device is to activate the plurality of command input receivers.

22. The system of claim 18, where the first command for the reset control is a command that does not require clock alignment.

23. The system of claim 22, wherein the first command includes constant signal values on one or more of the command input pins.

24. The system of claim 23, wherein the first command includes a constant '0' signal on a first command input pin and a constant '1' on a second command input pin.

* * * * *